United States Patent [19]

Post et al.

[11] Patent Number: 4,823,736

[45] Date of Patent: Apr. 25, 1989

[54] BARREL STRUCTURE FOR SEMICONDUCTOR EPITAXIAL REACTOR

[75] Inventors: Robert C. Post; Kevin N. Bordelon, both of Dallas; Burl M. Moon, Richardson, all of Tex.

[73] Assignee: Air Products and Chemicals, Inc., Allentown, Pa.

[21] Appl. No.: 801,978

[22] Filed: Nov. 26, 1985

Related U.S. Application Data

[63] Continuation-in-part of Ser. No. 757,539, Jul. 22, 1985, abandoned.

[51] Int. Cl.[4] .............................................. C23C 16/00
[52] U.S. Cl. ..................................... 118/730; 118/728; 118/729; 118/500
[58] Field of Search ...................... 118/729, 730, 50 D, 118/728

[56] References Cited

U.S. PATENT DOCUMENTS

| | | | |
|---|---|---|---|
| 3,749,383 | 7/1973 | Voigt et al. | 219/10.49 R X |
| 3,796,182 | 3/1974 | Rosler | 118/730 X |
| 4,099,041 | 7/1978 | Berkman et al. | 118/728 X |
| 4,496,828 | 1/1985 | Kusmierz et al. | 118/730 |
| 4,612,207 | 9/1986 | Jansen | 118/730 X |

Primary Examiner—Shrive Beck
Attorney, Agent, or Firm—Richard A. Dannells, Jr.; William F. Marsh; James C. Simmons

[57] ABSTRACT

A multipiece susceptor assembly that includes a generally flat polyhedron shaped top and bottom defining a plurality of facets on which panels are secured for supporting wafers to be processed. Various embodiments are disclosed including a top plate that receives a slide. The polyhedron shape portion further includes a multifaced side which includes an open side face that receives a single face mounted on the slide. A bottom plate is provided that fits within the bottom frame. The single side face structure to mount on the slide and the bottom frame prevents displacement of the slide and holds the slide against the frame during rotation of the susceptor. In another embodiment each individual panel is secured to the top plate by a hanger on the panel inserted in a cavity on the top plate while the panel is secured to the bottom plate in a locking relation by a notch in the panel interfitting with a triangular tab extending outward from the bottom plate. A back draft on the tab secures the panel against outward movement. The individual panels are likewise joined together by a tongue and groove interfitting such that when assembled the panels collectively form on enclosure that protects the interior against entry of gases and light from the surrounding process environment.

2 Claims, 7 Drawing Sheets

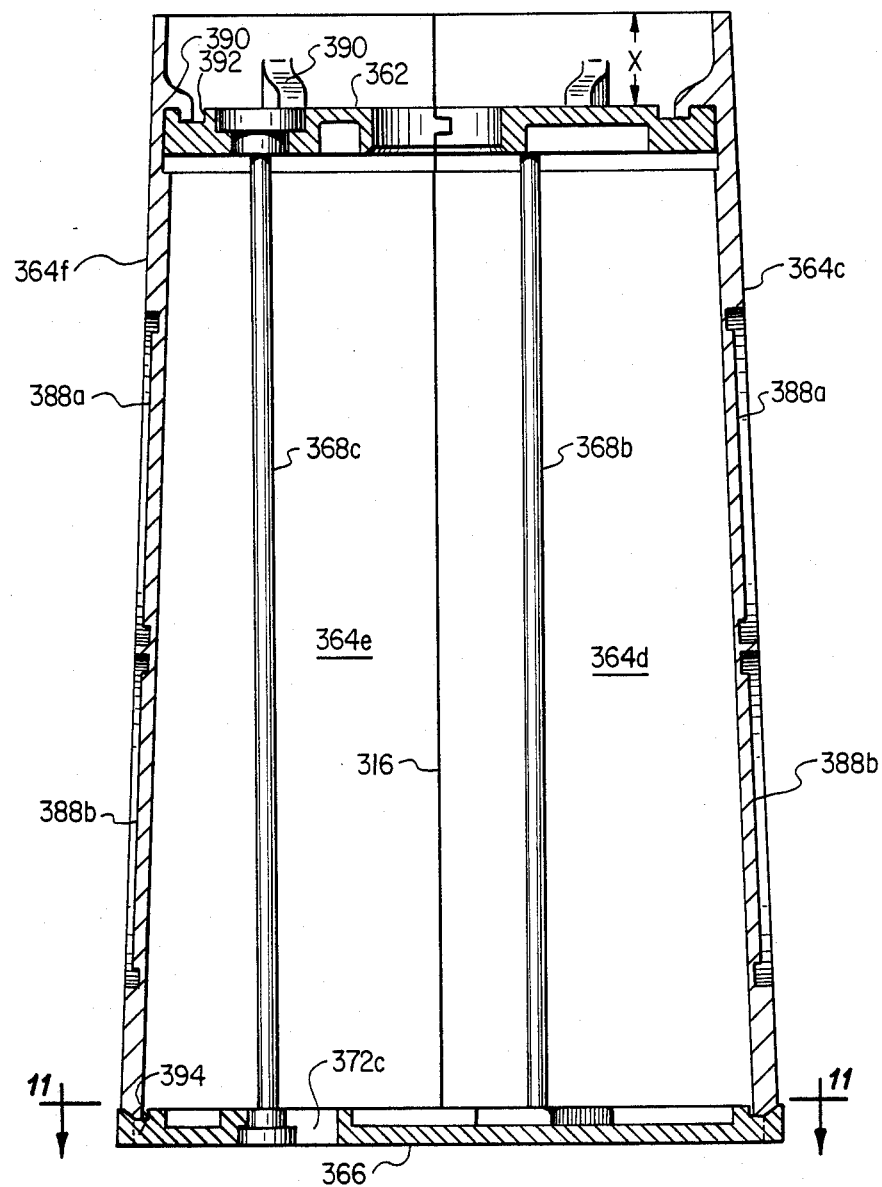
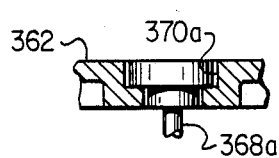
FIG. 12
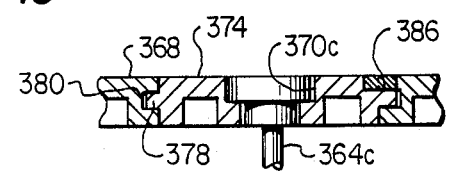
FIG. 13
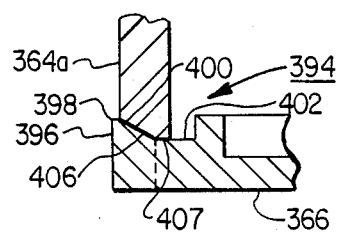
FIG. 14

BARREL STRUCTURE FOR SEMICONDUCTOR EPITAXIAL REACTOR

This application is a continuation-in-part of prior application Ser. No. 757,539 filed July 22, 1985 in the names of Robert Post and Kevin Bordelon now abandoned.

TECHNICAL FIELD

This invention relates to a structure used to hold semiconductor wafers during integrated circuit manufacturing processes and more specifically, to a barrel structure to hold semiconductor wafers in semiconductor fabrication reactors.

BACKGROUND OF THE INVENTION

The manufacture of integrated circuits involves the etching and coating of silicon wafers in accordance with a predescribed process to fabricate electric components upon the silicon wafer surface. After production, the silicon wafer is then diced into individual integrated circuits.

During the manufacturing process, the semiconductor wafers are subjected to several chemical reactive steps that provide coating and etching of layers deposited on the semiconductor wafer surface. One such process includes a reactor structure that produces a flow of chemical gases across the surface of wafers supported in cavities on an epitaxial susceptor barrel of silicon carbide coated graphite that rotates within the reactor. In such process, an interior portion of the reactor includes a quartz container surrounded by quartz halogen lamps that provide heating. Chemical gases in the process flow through the container exit into contact with the wafer surfaces. The gases, when flowing through the container exit at the base after flowing across the susceptor barrel containing the cavities in which the semiconductor wafers being processed are supported exposed to the environment. The barrel rotates inside the quartz container as the gases are flowing across the wafer surfaces. Depending inward of the reactor is a quartz hanger through which an infrared temperature sensor is projected inward of the barrel. The sensor monitors the temperature of the inside of the barrel within the quartz container that can vary from about 30° C. to 1400° C. within an hour time period. The barrel also serves to protect the temperature sensor from the lamp light and from the circulating gases within the quartz container.

U.S. Pat. No. 4,496,828 discloses a susceptor barrel structure for processing of the supported wafers. As disclosed therein the barrel structure is comprised of a plurality of side panels mounted on both a top plate and bottom plate by an interfit with a continuous groove in each of the respective plates. A problem characterized by this construction is the need for mounting at least two opposing side panels onto the top plate before the bottom plate can be seated.

Since, by the very nature of the semiconductor manufacturing process, the gases introduced may be extremely corrosive and the barrel must be periodically cleaned to remove coating build up, the barrel must be periodically replaced resulting in reactor downtime. Additionally, the barrel must be replaced when different wafer sizes are being manufactured. Therefore, a need exists for a barrel that facilitates installation and removal to reduce the downtime of the reactor as much as possible. Moreover, the prior art barrel constructions have been characterized by surface irregularities that have caused undesirable disturbance of the gas flow.

Despite recognition of the problem associated with such prior reactor structures, a ready solution to the problems has not heretofore been known.

SUMMARY OF THE INVENTION

In accordance with the present invention a barrel-shaped susceptor is provided that includes a generally polyhedron-shaped portion having a flat polygon top plate and a multifaced side connected to a bottom frame. The top plate includes an opening to receive a top slide. A bottom plate sized to fit within the bottom frame is also provided. The construction hereof eliminates many of the surface irregularities about the external surfaces of the susceptor that previously obstructed or disturbed the gas flow. At the same time it affords a mount for the individual susceptor panels that substantially enhances barrel integrity for protecting the interior against penetration by the processing gas flow and/or light.

In one embodiment of the present invention the generally polyhedron shaped portion top plate includes means to receive rails located on the side of the top slide enabling the top slide to be mounted within an opening of the top plate. The top plate and slide assembly further provide an opening receiving a susceptor support. The top plate and slide assembly also include formations to receive a disk that, when in place, prevents the top slide from outward displacement during susceptor rotation. The slide includes an opening to receive a hook from the rear of the single side face to support the single side face when the slide is mounted on the top plate. Since the single side face hook is located on the back side of the single side face, the single side face front portion is generally a flat plane. The bottom frame includes a lock located on the open side portion of the frame that mates with a complementary groove in the single side face, preventing, when the single face is mounted therein, movement away from the frame during rotation of the susceptor. The single side face, the top slide, the bottom plate and the polyhedron shaped portion are all sized such that when assembled, the interior portion of the susceptor will be protected from gases and light provided external to the susceptor.

In another embodiment the bottom plate also includes an integral outwardly extending lock located on each side facet of the frame that has a backdraft adapted to interfit with a complementary groove in the individual susceptor panels. In this manner the individual panels are secured against lateral displacement toward or away from the frame during rotation of the susceptor. In addition, each individual susceptor panel has vertical side edges shaped for an interfit with the adjacent susceptor panel that collectively along with the top plate and bottom plate afford the interior of the assembled susceptor protection against penetration of gas or light utilized in the wafer processing environment.

The present invention provides a barrel structure that permits ease of assembly while protecting the temperature sensor during the manufacturing process.

The present invention further provides a barrel structure that includes a mechanism for stabilizing the susceptor panel during rotation.

BRIEF DESCRIPTION OF THE DRAWINGS

The novel features and uniqueness of the invention as are set forth in the appended claims of the invention itself, both as to the construction and method of operation, together with additional objects, features and advantages thereof will be understood from the following description when read in conjunction with the accompanying drawings wherein:

FIG. 10 is a sectional elevation as seen substantially along the lines 10—10 of FIG. 9;

FIG. 12 is a fragmentary sectional view as seen substantially along the lines 12—12 of FIG. 9;

FIG. 13 is a fragmentary sectional view as seen substantially along the lines 13—13 of FIG. 9;

FIG. 14 is a fragmentary sectional view as seen substantially along the lines 14—14 of FIG. 11;

Referring now to the drawings, FIG. 1 illustrates an interior portion of the reactor including a quartz container 52 surrounded by quartz halogen lamps 50 that provide heating. Chemical gases in each process are flowed through the container 52 from area 62 in the direction 60 as shown to react with the wafer surfaces. The gases, when flowing through container 52 exit at the base after flowing across the epitaxial susceptor barrel 58 of silicon carbide coated graphite and that includes cavities for supporting the semiconductor wafers contained therein. The barrel 58 rotates inside the quartz container 52 as these gases are flowing across the wafer surfaces. Barrel 58 is positioned on a quartz hanger 56 for rotation. Interior to the quartz hanger 56 is an infrared temperature sensor 54. This sensor 54 monitors the temperature of barrel 58 in the quartz container 52 which may vary from 30° C. to 1400° C. within an hour time period. Barrel 58 is constructed to protect the temperature sensor 54 from the light of lamps 50 and from the gases that circulate inside the quartz container 52.

Figure 1:
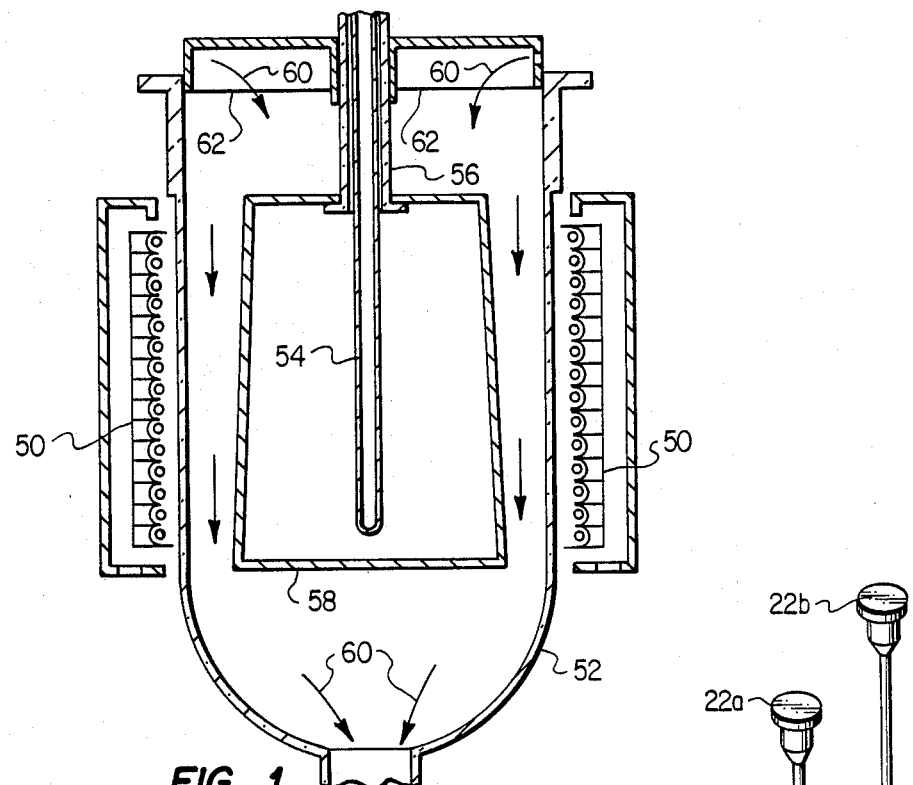
FIG. 1 is a sectional view of a semiconductor fabrication process reactor.

Several different types of epitaxial susceptor barrels exist in the prior art. One such barrel is illustrated in FIG. 2A in which a top plate 10 would be mounted on hanger 56 (FIG. 1) to provide support for the barrel assembly. The barrel top plate 10 receives a top slide 12 to fully enclose the hanger 56. The top plate 10 and slide 12 both include slots 14 and 16 respectively that receive a disk 18. Disk 18 is provided to prevent slide 12 from sliding outwardly when the barrel assembly is rotated in the reactor during the manufacturing process. The barrel further includes linking rods 22a, 22b and 22c that are provided to extend from the holes 40a, 40b, and 40c in the top plate 10 and slide 12 downwardly to receive the bottom plate 24 through openings 37a, b and c. The top plate 10 and slide 12 when assembled form a polygon shape which is similar to that of the bottom plate 24. Each top plate 10 polygon surface includes a hanger 30 to receive a receptor panel such as 20a through 20g. Hanger 30 protrudes beyond the surface of the receptor panel 20a potentially causing disturbance of the gas flow. The receptor panel 20b is shown to include three semiconductor wafer cavities 38a, 38b, and 38c. The panel 20b further includes a hole 32 to receive the hanger 30. At the base of panel 20b is a notch 34 which is positioned over stub 36 of the bottom panel 24 but does not hold the panel in place. In this manner, the susceptor panels 20a through 20g may be individually assembled around the top plate 10 slide 12 and bottom 24 to enclose the temperature sensor that extends through hole 42. A problem encountered with this structure is that the susceptor panels tend to warp with age resulting in gaps between panel joints that permit gas and light exposure to the temperature sensor.

Figure 2A:
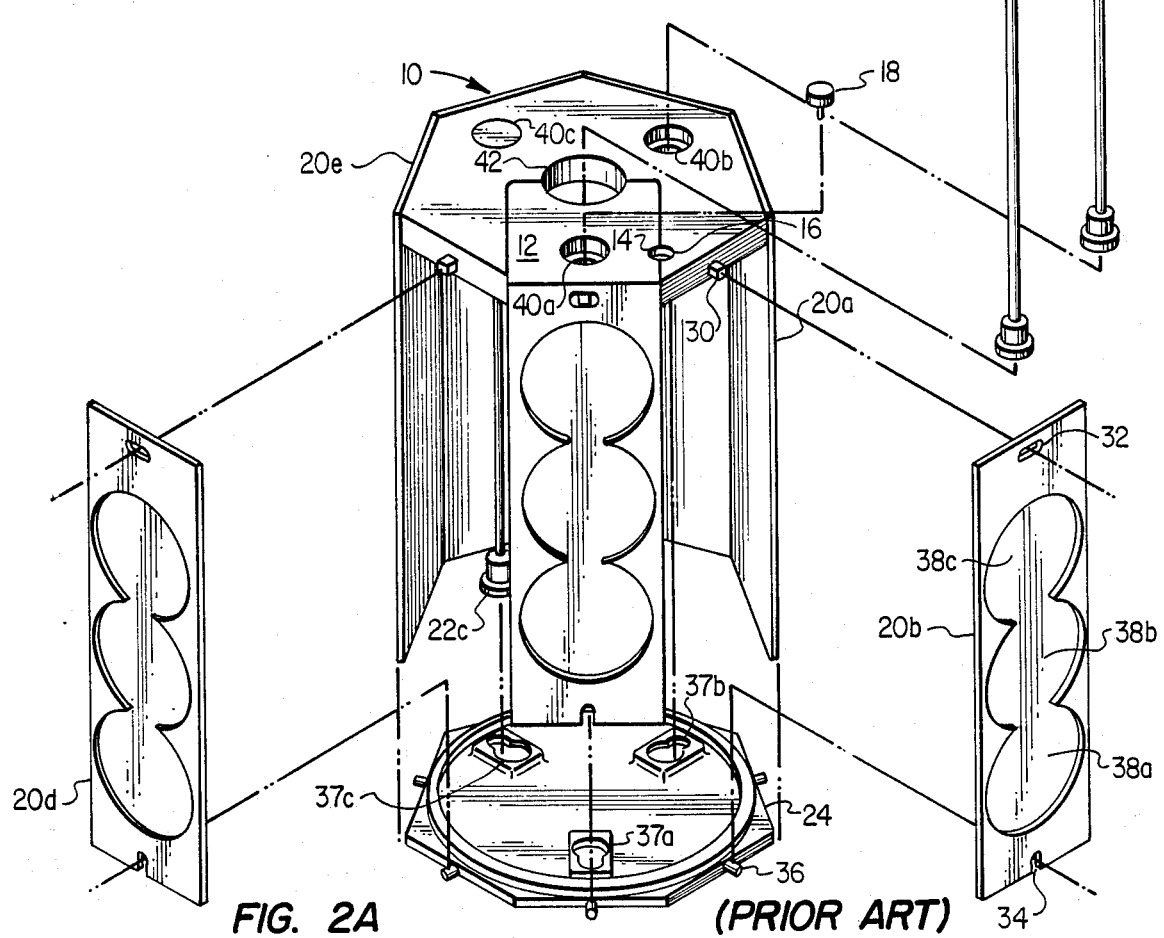
FIG. 2A is an exploded isometric illustration of a prior art susceptor barrel including detachable susceptor panels.
Figure 2B:
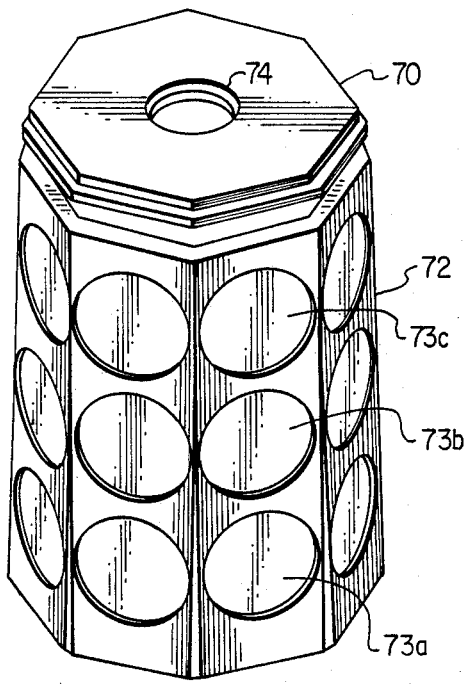
FIG. 2B is an exploded isometric illustration of a prior art susceptor barrel including a one piece polygon barrel assembly on a one piece top plate.

Another prior art barrel assembly is illustrated on FIG. 2B which consists of a one piece top plate 70 that is mounted on the quartz hanger 56 (FIG. 1), requiring the quartz to be removed during assembly, and a unitary barrel 72 consisting of a multifaced polygon side wherein each face includes cavities 73a, 73b and 73c for containing the semiconductor wafers. As can be appreciated, the mounting of barrel 72 onto plate 70 including the temperature sensor extending through opening 74 could be relatively difficult. However, the unitary barrel does offer more certainty of protection from gases and light for the temperature sensor than does the previously discussed structure.

Figure 2C:
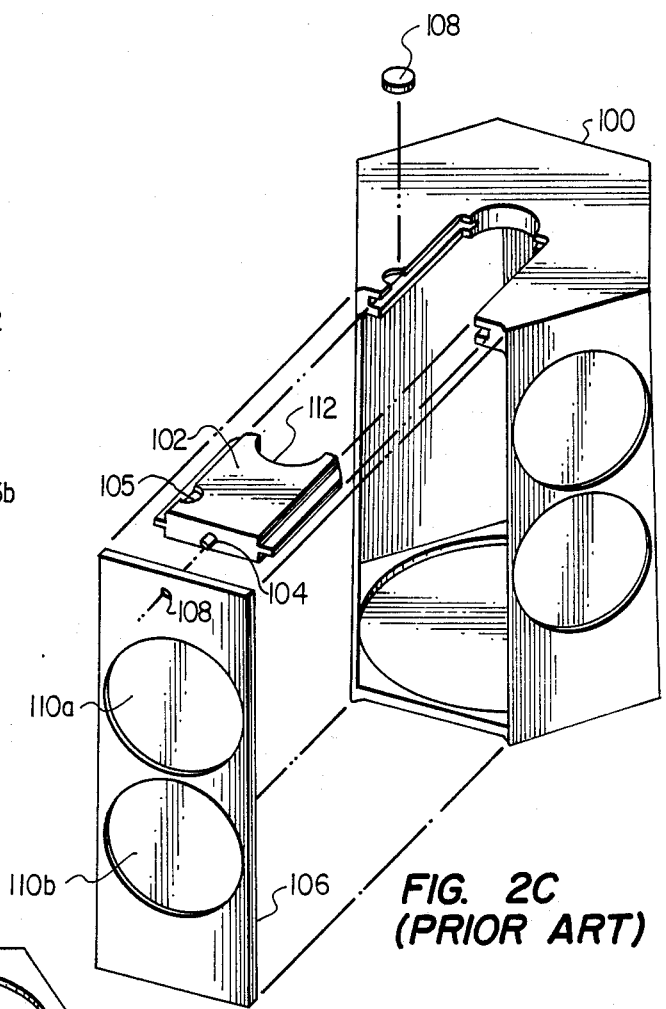
FIG. 2C is an exploded isometric illustration of a barrel structure including an open face for receiving a susceptor panel.

The prior art embodiment of FIG. 2C illustrates another barrel arrangement that provides a partially unitary barrel structure 100 with an open side face and an open top portion to receive a slide 102. This prior art embodiment facilitates the mounting of the barrel onto the quartz hanger by allowing the barrel 100 to be moved laterally to engage the hanger 56. The slide 102 is then installed to enclose hanger 56. Again, a disk slot 105 with a corresponding disk slot on the top portion of barrel 100 is provided to receive a disk 108 to prevent the slide 102 from lateral displacement during the rotation of the barrel. The susceptor panel 106 including the wafer cavities 110a and 110b is then mounted on the hanger 104 of slide 102 by positioning hanger 104 through the opening 108 of panel 106 that can result in disturbance to gas flow. The barrel 100 further includes a circular base plate or bottom plate (not shown) that is inserted through the open face of barrel 100 to cover the base portion or the bottom portion of the barrel preventing gases from flowing upward inside the barrel during the manufacturing process. It is common to use a circular shaped bottom plate panel that fits inside a circular groove within the base portion of barrel 100. However, since barrel 100 must be a polygon, the barrel 100 portion frame to receive the circular bottom plate includes corner portions extending from the perimeter of the circular bottom plate to the corners of the bottoms parts of the susceptor panels. These corner portions include more barrel material than the middle sections adjacent to the bottom center portions of each panels. Since the barrel is subjected to temperatures that vary from room temperature to 1200° to 1400° C. every hour, the thermal expansion of the thicker corner portions versus the expansion of the smaller sections of the thinner middle sections can incur cracking of the base portion of these barrels. Susceptor panel 106 further includes a hole 122 to receive the hanger 120.

Figure 2D:
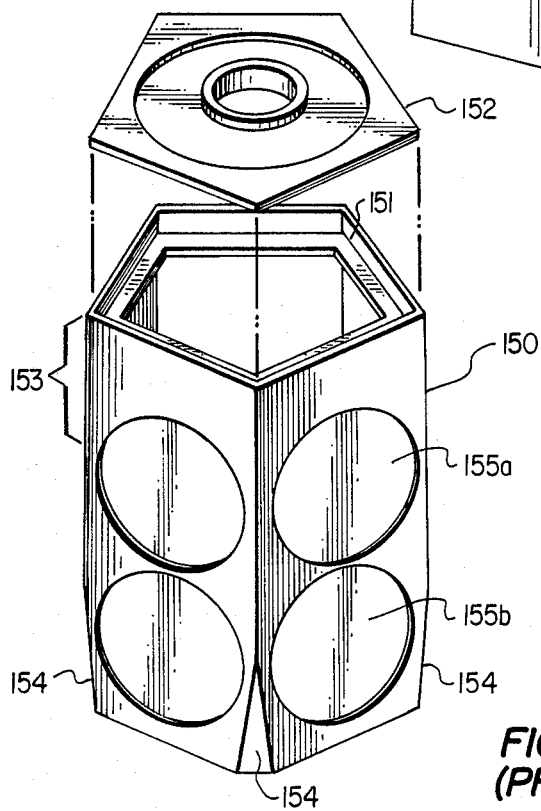
FIG. 2D is an exploded isometric illustration of a prior art barrel structure having an extended top portion and dart structure.

Still another prior art embodiment is illustrated in FIG. 2D that includes a single piece barrel 150 mounted on a top plate 152 as shown in a manner similar to that discussed in FIG. 2B. However, the barrel structure in FIG. 2D includes an extended portion 153 that extends over the top of a flange 151 placed to receive the top plate 152 that includes rounded corners provided to allow heat expansion. This extended portion 153 provides for additional heating of the gases as the gases are introduced into the quartz container 52 (FIG. 1) before they first encounter the wafers. Another feature is the dart sections 154 that are provided about the perimeter. In this configuration, the dart portions 154 are provided to increase gas flow by removing obstructions at the base portion of the barrel 150. This is required since the susceptor panels are configured at a 2 to 3 degree angle to extend outwardly for maintaining the wafers in their respective cavities 155a and 155b and the wider barrel bottom portion corners would restrict gas flow because of their proximity to the quartz container 52. In another enhancement, the dart areas are extended upwardly to effect rectangular faces and to permit a uniform flow of gas laterally across the surface of the susceptor panels and therefore more uniformly across the wafer surfaces during the rotation of the barrel.

The structure of FIG. 2A also detrimentally permits the susceptor panels to swing outwardly during rotation enabling gases and light to enter the interior portion of the barrel assembly exposing the temperature sensor while disturbing gas flow across the surface of the susceptor panels. While the unitary barrel susceptor panel assemblies such as in FIGS. 2B and 2D tend solve the problem of gases flowing through the panel sides into the interior portion which can result in damage to the temperature sensor, these one piece structures are difficult to assemble resulting in up to 30 minutes of reactor downtime per change. The structure in FIG. 2C is provided for an ease of assembly onto the quartz hanger by permitting assembly within about five minutes, but the susceptor panel tends to swing outwardly during rotation disturbing the gas flow across the susceptor panels while detrimentally permitting gases and light to enter the interior portion of the barrel exposing the temperature sensor.

Figure 3:
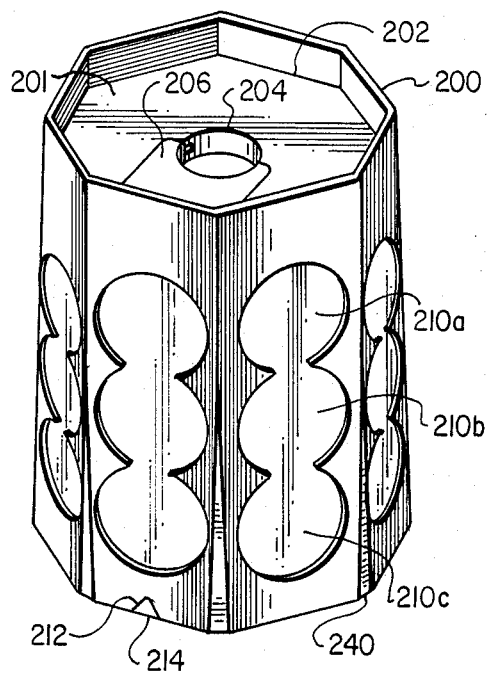
FIG. 3 is an isometric view of the invention assembled in accordance with a first embodiment.

FIG. 3 illustrates a first embodiment of the present invention in assembled form in which barrel 200 is provided with an open facet face and an opening 204 to receive the quartz hanger with temperature sensor. As in the prior art embodiment in FIG. 2C, barrel 200 may be mounted laterally over the quartz hanger being secured by top slide 206 positioned against opening 204 as shown and including the upward extension 202. The panel 208 that includes wafer cavities 210a, 210b, and 210c is mounted by a hook 230 (FIG. 4B) onto slide 206 at the top and by a groove 212 onto a dovetail lock 214 on the bottom. Furthermore, this embodiment includes a dart structure 240 along all facet edges of the barrel 200 and barrel plate 208 to effect rectangular faces permitting laterally uniform gas flow across the wafers contained therein while maintaining the 2 to 3 degree angle required to keep the wafers in their respective cavities.

Figure 4A:
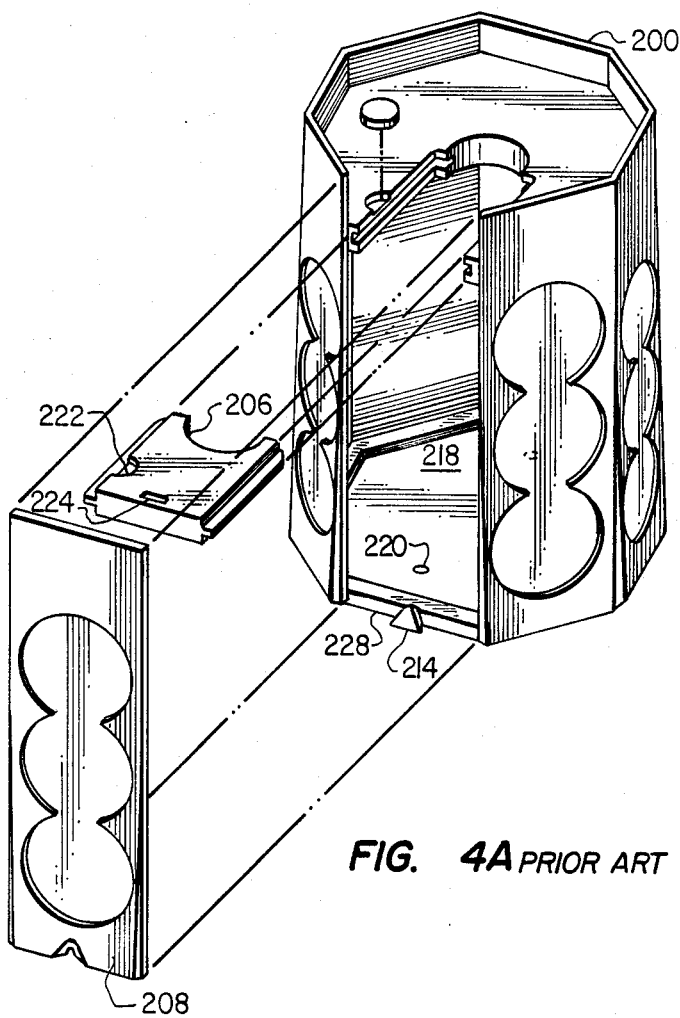
FIG. 4A is an exploded isometric view of the embodiment of FIG. 3 as partially disassembled.
Figure 4B:
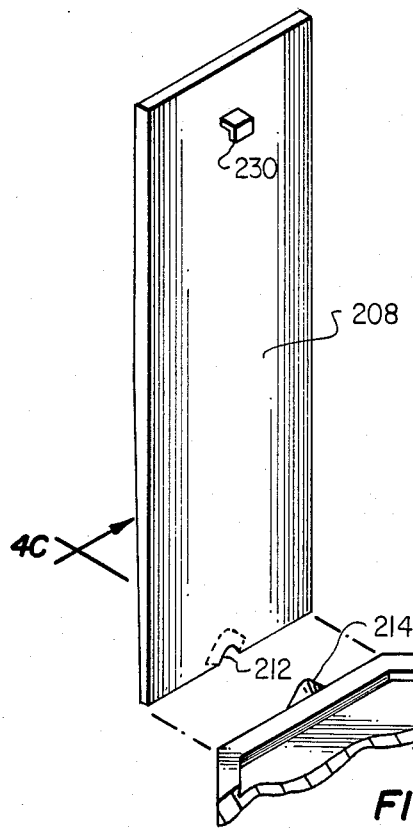
FIG. 4B is a partial exploded isometric view of the back portion of the susceptor panel.
Figure 4C:
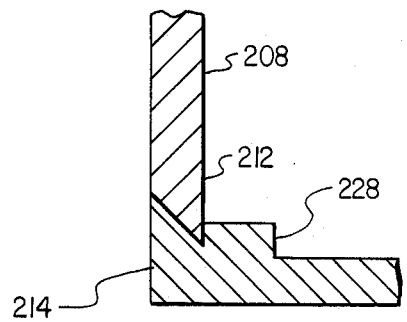
FIG. 4C is a sectional view of the susceptor panel joined to the bottom frame and lock as seen substantially from the position 4C—4C of FIG. 4B.

FIG. 4A illustrates barrel 200 in a disassembled form showing the slide 206 including cavity 224 to receive the hanger hook 230 from the susceptor panel 208. Slide 206 further includes the disk receiving slot 222 positioned adjacent to a similar slot on the top plate portion of barrel 200 to receive a disk for preventing lateral displacement of slide 206 during the rotation of the barrel assembly. The bottom plate 218 including two gas purge holes 220 (only one shown) is provided as a separate piece that is inserted through the open face of barrel 200 to be positioned to rest on the extending edge of the edge base perimeter 228 of barrel 200. The front side susceptor panel 208 also includes the notched groove 212 to mate with a complementary dovetail lock 214 positioned on the base perimeter 228. The back portion of the susceptor panel 208 is illustrated in FIG. 4B and includes the hook 230 and tapered groove 212. FIG. 4C illustrates another view of the dovetail lock 214 that mates with the groove 212. The dovetail lock 214, complementary groove 212 and hook 230 permit for the ease of assembly of the susceptor panel 208 onto the barrel 200 and slide 206 while also preventing any lateral or outward movement of the panel 208 during the rotation of the barrel structure.

Figure 5:
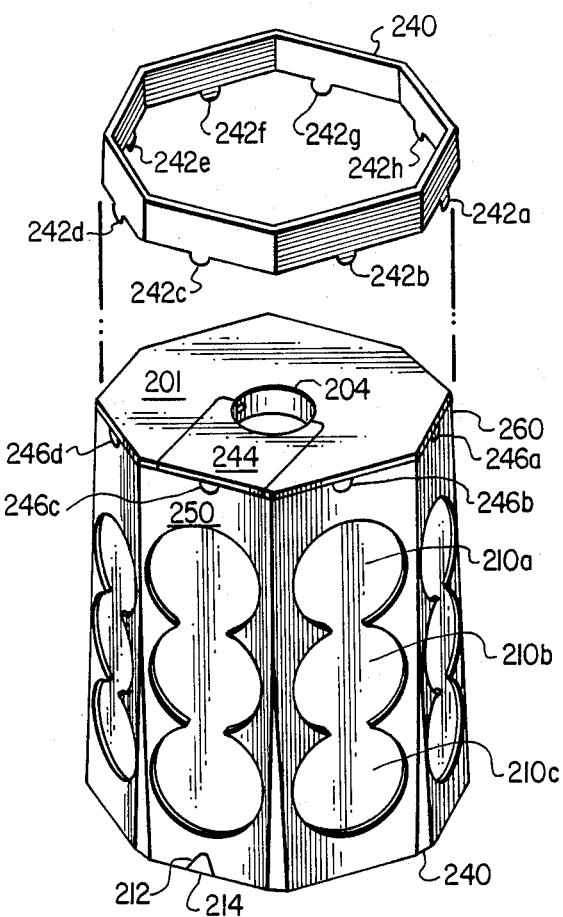
FIG. 5 is an exploded isometric view in accordance with a second embodiment of the invention including a crown.
Figure 6A:
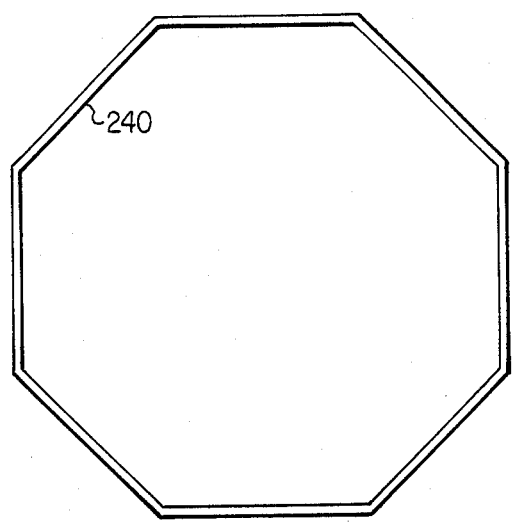
FIG. 6A is a top view of the crown.
Figure 6B:
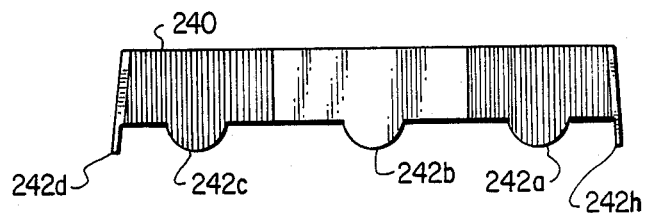
FIG. 6B is a side view of the crown.
Figure 7:
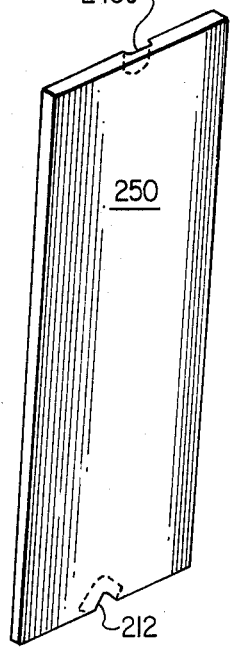
FIG. 7 is a rear isometric view of the susceptor panel.

A second embodiment is illustrated in FIG. 5 in which barrel 260 includes a top plate 201 assembled with slide 244 to form the hanger opening 204. In this embodiment there is no means to lock the slide 244 to the top plate 201. The susceptor panel, similar to susceptor panel 208 in FIG. 3, is mounted in the barrel 260 open face area and includes notched groove 212 to mate with the dovetail lock 214. The upper portion of panel 250 and the slide 244 are held in position by the crown 240 that mounts on mounting tabs 242a-h which mate with corresponding panel notches 246a-h. FIG. 6A is a top view of crown 240. FIG. 6B is a side view of crown 240 illustrating the mounting tabs 242a-d and 242h. FIG. 7 is a rear isometric view of panel 250. This embodiment permits different crowns with varying height extensions to be used on the same barrel structure. It should also be understood that the crown 240 may include more than one piece wherein the two or more crown pieces would interlock forming the crown assembly for holding the barrel assembly components in place during rotation of the barrel assembly.

Figure 8:
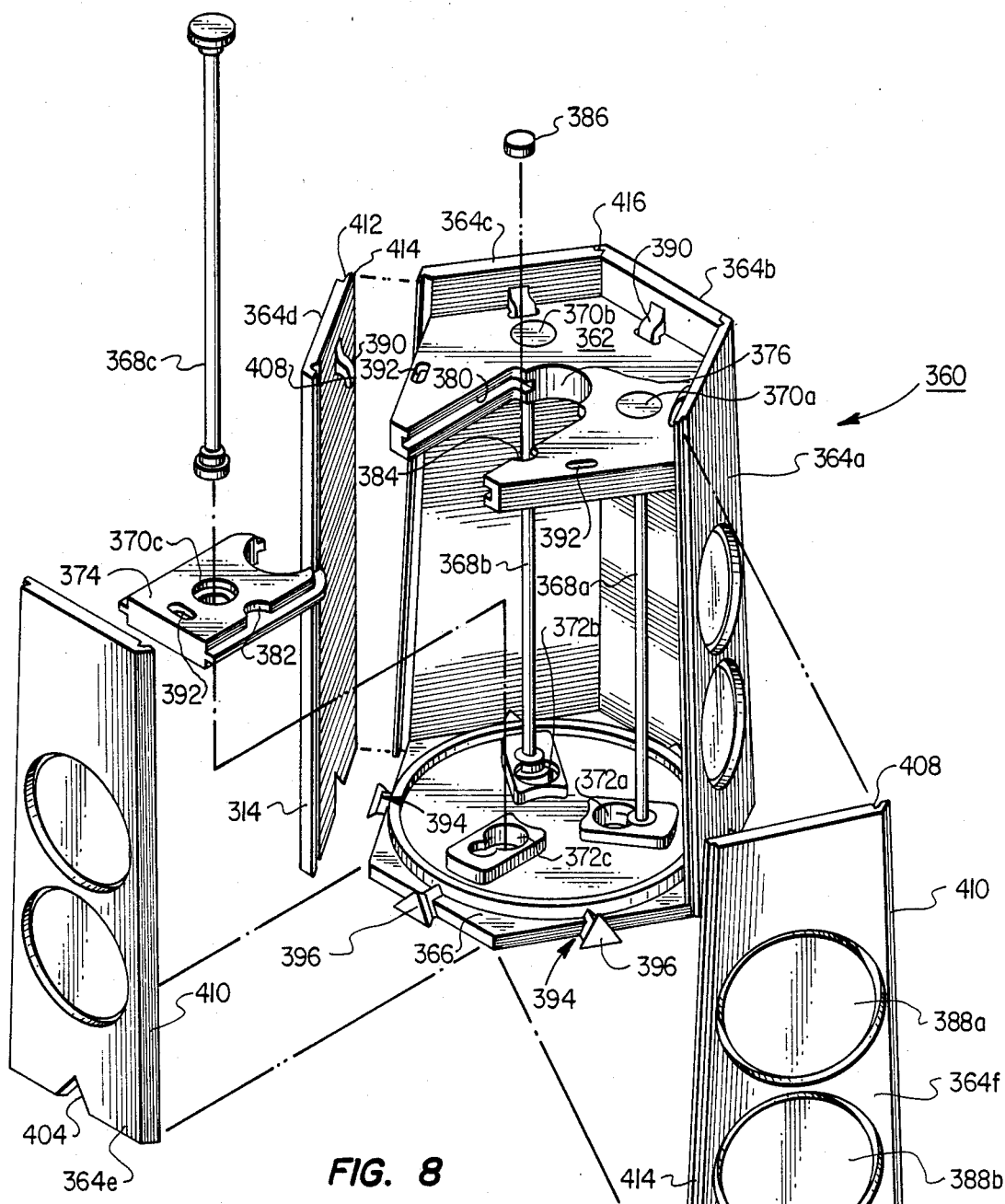
FIG. 8 is an exploded isometric view of the invention assembled in accordance with a third embodiment of the invention.
Figure 15:
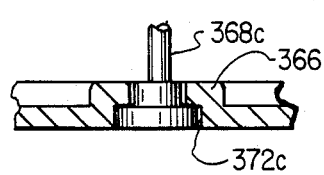
FIG. 15 is a fragmentary sectional view as seen substantially along the lines 15—15 of FIG. 11.
Figure 16:
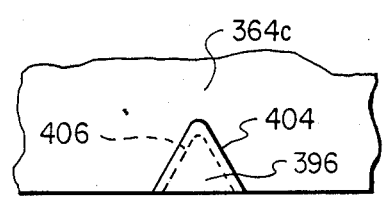
FIG. 16 is an enlarged fragmentary elevation as seen substantially from the position 16—16 of FIG. 11.
Figure 9:
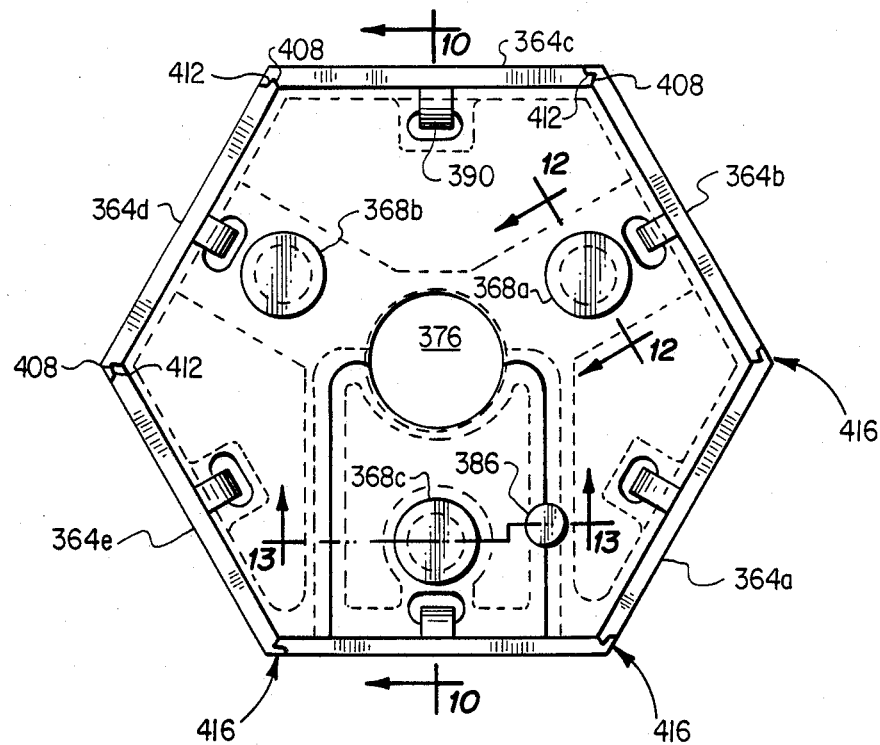
FIG. 9 is a top plan view of the barrel structure of FIG. 8.
Figure 11:
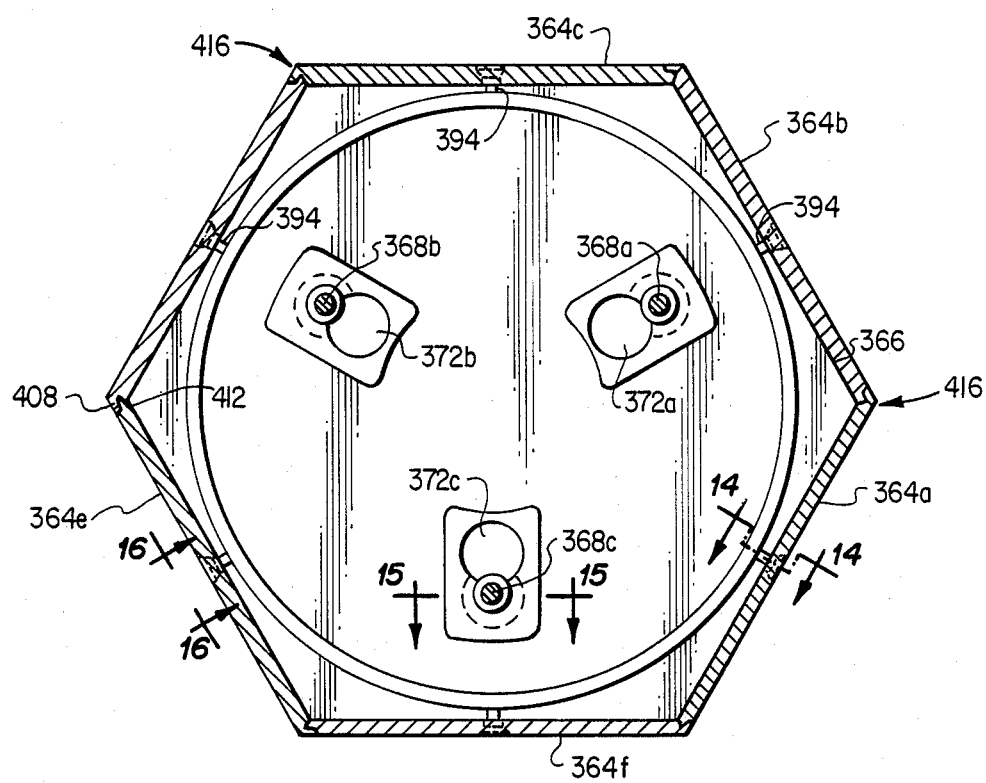
FIG. 11 is a sectional view as seen substantially along the lines 11—11 of FIG. 10.

FIG. 8 illustrates a third embodiment of the present invention in assembled and exploded form in which the barrel designated 360 is comprised of a polyshaped top plate 362 on which is supported six individual susceptor panels 364a through 364f. At the underside of the barrel assembly is a corresponding polyshaped bottom plate 366 adapted to interlock with each of the individual panels 364 as will be described and is hung from the top plate via three individual vertical rods 368a, 368b and 368c.

Extending through top plate 362 for receipt of the rods are bored and counterbored apertures 370a and 370b which align with slotted bores and counterbores 372a and 372b contained in bottom plate 366 for receiving and securing vertical rods 368a and 368b respectively. A similar aperture 370c is contained in slide 374 which when positioned in top plate 362 aligns with aperture 372c for receipt and securement of rod 368c.

Centrally formed in top plate 362 is an aperture 377 through which to receive the quartz hanger 30 with temperature sensor 54 shown in FIG. 1. For receiving slide 374 the slide includes side rails 378 on each side for slidable insert within matching top plate grooves 380. Included in the top faces of the slide is a semi circle cavity 382 that when in position in top plate 362 registers with semi circle cavity 384 in the top plate for receipt of circular disc 386. With disc 386 in position slide 374 is secured against lateral displacement outward during the course of barrel rotation.

Each of the susceptor panels 364 includes a pair of vertically oriented wafer cavities 388a and 388b. In accordance with this embodiment of the invention, the panels, when collectively assembled onto top plate 362 and bottom plate 366, as will be appreciated, provide about the cavities a smooth exterior surface that is relatively obstruction free to the process gases as will be flowing in contact therewith. At the same time, the locked mounting of the panels in position along with longitudinal interfitting joints formed between contiguous sides of adjacent panels assures the continuing integrity thereat for preventing entry of gases or light during wafer processing. This not only prevents any displacement or whatever of the panels in the course of rotation during processing but also eliminates disturbance to the surrounding gas flow as has previously been incurred. Being that the adjacent panels are interfitted one to the other they secure each other against any relative bowing of the panels whereby gas flow and/or light could undesirably penetrate or gain entry to the interior of barrel 360.

For achieving the foregoing, as further illustrated in FIGS. 9-16, there is provided centrally located on the backside below the top of each panel 364 a downwardly depending hook 390 secured thereto and adapted to be inserted within an oblong recess 392 contained in top plate 362 and in slide 374. When the hooks are inserted, each panel will be secured at its topside against the edge face of the top plate facet thereat.

For securing each of the panels at its bottom side to bottom plate 366, there is provided extending laterally integral from each facet of the edge base perimeter a triangular lock tab 394 that terminates outwardly in a distal face 396. About the face is a normally extending edge 398 which rearward thereof is provided with a backward downdraft 400 (see FIG. 14) that merges with the horizontal apex 402. For cooperating with the tab 394 in order to effect a lateral interlock therewith, each panel at its underside includes a centrally located triangular notch 404 having a complementary back draft 406 and a back edge 407. As shown in FIG. 14, leftward movement of panel 364a is positively precluded by virtue of the interlock formed between notch 404 and tab 394.

To effect an interfitting of adjacent panels one to the other in an overlapping contiguous interlocking engagement, each of the panels 364 along its backside includes a vertically extending longitudinal groove 408 parallel to side edge 410 and a vertically extending longitudinal tongue 412 formed along its side edge 414. Each of grooves 408 and tongues 412 extend the full panel height top to bottom. In this manner, each of the panels when assembled to its adjacent panel forms a more or less dovetail joint 416 (see FIGS. 9 and 11) nesting the adjacent panels with the side tongue 412 of the one panel interfitting the groove 408 of the adjacent panel. The resulting external surface at joint 416 is flush and continuous without any perceptible seam or obstruction that could disturb gas flow. Likewise, the corners formed about joint 416 are sharp and without distortion. Where desired, all of the panels 364 could conveniently extend above the surface of top plate 362 any desired distance "X" as shown in FIG. 10. to establish gas flow control and preheating of the gases before encountering the silicon wafers. FIG. 17 illustrates plug 500 which is an alternate embodiment to securing the lower ends of vertical rods 368a, 368b and 368c within counterbores 372a, 372b and 372c of bottom plate 366. Plug 500 is shown in FIG. 8 mounted in counterbore 372a.

By means of the invention disclosed above, a superior barrel construction is provided over constructions that had been previously known in the prior art. While having a variance between embodiments, the invention thus includes the polygon bottom panel permitting thermal expansion without damaging the base portion barrel structure, dart formations on the susceptor panel edges permitting uniform lateral gas flow, and an extended top portion for preheating the gases before they encounter the silicon wafers, and an ease of assembly onto the quartz hanger through the open facet face of the barrel which in turn easily receives the bottom plate for assembly therein. After positioning the barrel portion on the hanger, the ease of assembly of the top slide and the receptor panel are provided in a manner that prevents lateral displacement of the panel during rotation. Additionally, the removable susceptor may be replaced by a temperature susceptor panel which is shaped as the removable susceptor panel but includes a series of temperature thermocouples that may be used to perform temperature profile studies upon the reactor in use. The use of this invention facilitates the accomplishment of such temperature profile studies by providing an assembly that is easily reconfigurable to include the temperature susceptor panel without excessive reactor downtime.

In the third embodiment of the invention each individual panel is mounted secured in a locked position to the top and bottom plates while each of the adjacent panels about the facets of the barrel are interlocked to each other to preclude formation of potential openings that could otherwise occur. By virtue of the complete interlocking afforded thereby, the susceptor assembly is assured of interior protection against penetration or entry of the flowing gases and/or light that are utilized in the wafer process surrounding the rotating barrel. The advantages afforded thereby should be instantly recognized because of the known difficulty and expense normally associated with the processing of such wafers and which is significantly reduced by means of the susceptor barrel arrangement provided herein.

Since many changes could be made in the above construction and many apparently widely different embodiments of this invention could be made without departing from the scope thereof, it is intended that all matter contained in the drawings and specification shall be interpreted as illustrative and not in a limiting sense.

What is claimed is:

1. In a barrel-shaped susceptor for holding wafers exposed in a wafer processing environment, said susceptor comprising:

a flat top plate of generally polyhedron configuration having a slide opening;

a bottom plate of generally polyhedron configuration similar to said top plate and spaced from and arranged generally parallel to said top plate;

means maintaining the spacing of said bottom plate relative to said top plate; and a plurality of individual susceptor panels each having a plurality of cavities for supporting the wafers to be processed and exposed in the processing environment, said individual susceptor panels extending above said top plate and between and about said top plate and said bottom plate to collectively enclose the spacing therebetween;

the improvement for preventing entry of gases and light into the interior of said susceptor and displacement of said panels during wafer processing which comprises:

lock means for securing each individual susceptor panel both to said top plate and to said bottom plate, said lock means comprising a cavity located normally inward from each facet face of said top plate, a back draft tab extending laterally outward from each edge facet of said bottom plate and cooperating means on each of said individual panels for interlocking with said cavity and said tab;

said cooperating means comprising a downwardly depending hook extending from the back face of a panel for insertion in the associated lock means cavity in the top plate and a notch defined in an underface of the same panel for engagement with said backdraft tab;

a top slide for mounting in the slide opening of said top plate for providing in combination with the top plate, an opening to receive one of said susceptor panels, the top slide further including means for supporting one of said susceptor panels comprising a cavity located normally inward from the facet face of said slide; and joining means for securing adjacent of said individual panels to each other in a secured joint formation that is substantially impervious to gas and light entry from the external processing environment, said joining means comprising a vertically extending longitudinal groove extending along one side edge of each of said individual susceptor panels substantially the entire length of the panel between said bottom plate and said top plate and a vertically extending longitudinal tongue extending along the other side of each of the panels substantially the entire length of the panel between the bottom plate and said top plate, whereby the tongue of one panel interfits with the groove of the adjacent panel to form an overlapping dovetail interfit therebetween and whereby said groove and said tongue are displaced generally behind the face plane of the panel of adjacent panels so that when the panels are joined they have a surface contour substantially uninterrupted by the joint formation threat that could disturb gas flow.

2. A barrel-shaped susceptor according to claim 1 in which said joining means comprises each of said individual susceptor panels having a vertical longitudinal groove extending along one side edge and a vertical longitudinal tongue extending along the other side edge whereby the tongue of one panel interfits with the groove of the adjacent panel to form an overlapping dovetail interfit therebetween.

* * * * *